METHOD FOR CONTROLLING THE CHARACTERISTIC OF A TUNNEL DIODE

Filed March 6, 1961

INVENTORS
PHILIP B. LAPE
MAX KUNZ
BY
Henry Huff
ATTORNEY 3,181,983

METHOD FOR CONTROLLING THE CHARACTERISTIC OF A TUNNEL DIODE

Philip Bruce Lape, South Norwalk, and Max Kunz, Fairfield, Conn., assignors to Sperry Rand Corporation, a corporation of Delaware Filed Mar. 6, 1961, Ser. No. 93,765
8 Claims. (Cl. 156—17)

The present invention generally relates to the production of tunnel diodes and, more particularly, to a method for controlling the current-voltage characteristic of a tunnel diode.

As is well understood in the art, a tunnel diode is a device having an abrupt P-N junction made from a heavily doped semiconductor material. The current-voltage characteristic of the tunnel diode generally resembles that of an ordinary diffused junction semiconductor diode except in the region of the characteristic corresponding to very small forward voltages. In this region, the tunnel diode current increases substantially linearly with increasing forward voltages until a peak current is reached. As the applied voltage increases beyond the value which produces said peak current, the tunnel diode current decreases (defining a region of negative resistance) to a small minimum value. As the applied voltage further increases beyond the value which produces said minimum current, the tunnel diode current begins to increase exponentially and thereafter increases with the applied voltage according to the characteristic of a conventional diffused junction semiconductor diode.

The ratio of the peak current to the minimum current is referred to as the "peak-to-valley" ratio. Uniformity of the value of said peak-to-valley ratio and of the value of the peak current are of particular concern in the quantity manufacture of tunnel diodes. Said values are critically determinative of the unique properties of tunnel diodes upon which all high performance computer applications depend.

It is the general object of the present invention to provide a method for controlling the current-voltage characteristic of a tunnel diode.

Another object is to provide a method for establishing a predetermined peak current in the current-voltage characteristic of a tunnel diode.

A further object is to provide a method for establishing a predetermined peak-to-valley ratio in the current-voltage characteristic of a tunnel diode.

An additional object is to provide a method for the controlled etching of a germanium tunnel diode to obtain a predetermined current-voltage characteristic.

These and other objects of the present invention, as will appear more fully from a reading of the following specification, are accomplished in a preferred embodiment by the controlled etching of a germanium tunnel diode. The semiconductor element of the diode comprises a germanium wafer which is heavily doped with arsenic. The germanium wafer is alloyed on one side to a pellet consisting of an indium-gallium alloy. The germanium wafer is alloyed on its other side to a gold wafer containing a small percentage of antimony. The base material (doped germanium) and the gold-antimony alloy are of the N-type, whereas the indium-gallium pellet is of the P-type. An abrupt junction is produced between the germanium wafer and the indium-gallium pellet.

The alloyed wafers and pellet are placed upon a diode etching stand. A controlled current is applied to the two diode terminals consisting of the indium-gallium pellet and the gold-antimony wafer, respectively. The value of the current produced by the source is adjusted to be substantially equal to the desired peak current which is to be exhibited by the current-voltage characteristic of the tunnel diode. Provision is made for periodically altering the flow of current to the tunnel diode and for continuously monitoring the potentials which appear across the terminals of the tunnel diode.

The diode is then etched with a solution consisting of three parts sodium hydroxide to one part hydrogen peroxide, the solution being diluted with five parts of distilled water for each part of solution. The etching solution preferentially attacks and removes various crystal imperfections and bubbles which form about the base of the indium-gallium pellet during the process in which the pellet is alloyed with the germanium wafer. It has been found that the value of the peak current and the value of the peak-to-valley ratio can be controlled by the etching of such imperfections and bubbles.

The etching is allowed to continue until an abrupt change in potential is observed across the diode terminals. At that time the etching process is terminated by flooding the diode element with distilled water.

For a more complete understanding of the present invention, reference should be had to the following specification and to the figures of which:

Figure 1:
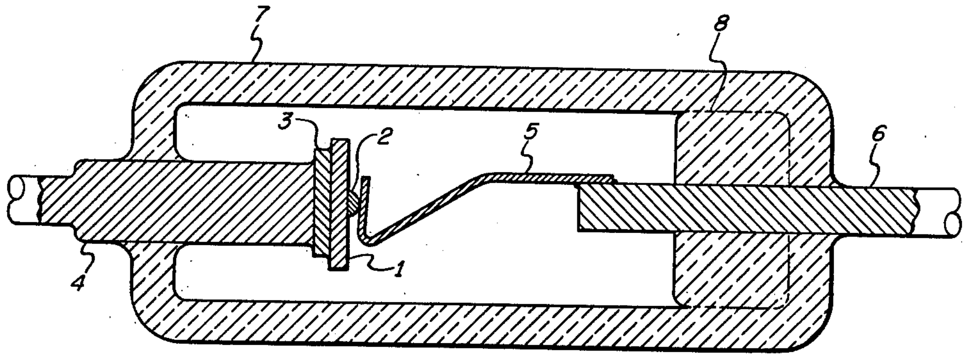
FIG. 1 is a simplified cross-sectional view of a typical tunnel diode whose current-voltage characteristic is to be controlled in accordance with the method of the present invention.

Referring to FIG. 1, the P-N junction of the tunnel diode is formed between the doped germanium wafer 1 and the indium-gallium pellet 2. The germanium having a resistivity in the range, for example, from about .0006 to about .0012 ohmcentimeters is doped with arsenic to provide the N-type area. Pellet 2 comprises an alloy of 99.3% indium and 0.7% gallium and provides the P-type area. Wafer 3 comprises an N-type soldering alloy of 99.4% gold and 0.6% antimony for establishing an electrical connection between germanium wafer 1 and dumet slug 4. Electrical contact is made to pellet 2 by means of spring member 5 comprising an alloy of 90% platinum and 10% iridium. Spring contacting member 5 is spot welded to dumet lead 6.

Prior to final assembly, an open ended glass sleeve 7 is fused to dumet slug 4. A glass bead (represented by the dashed line 8) is fused to dumet lead 6. The beaded lead 6 is inserted into the open end of the glass sleeve 7 to bring member 5 into contact with pellet 2. Then, the glass bead 8 is fused to the glass sleeve 7 to provide a hermetically sealed container for the tunnel diode.

A problem arises in fusing the glass bead to the glass sleeve. Inasmuch as glass softens at approximately 600° C. and the indium-gallium pellet melts at about 150° C., extreme care must be exercised to ensure that when the glass seal area is heated to 600° C., the temperature of the pellet remains below 150° C. This may be accomplished by placing an apertured aluminum disk or heat baffle about glass sleeve 7 between the positions of pellet 2 and bead 8. The baffle reflects a cold air blast which is directed around the outside of the envelope region containing pellet 2 while also reflecting the localized heat which may be applied to the region of the glass bead by means of, for example, a heating coil.

Figure 2:
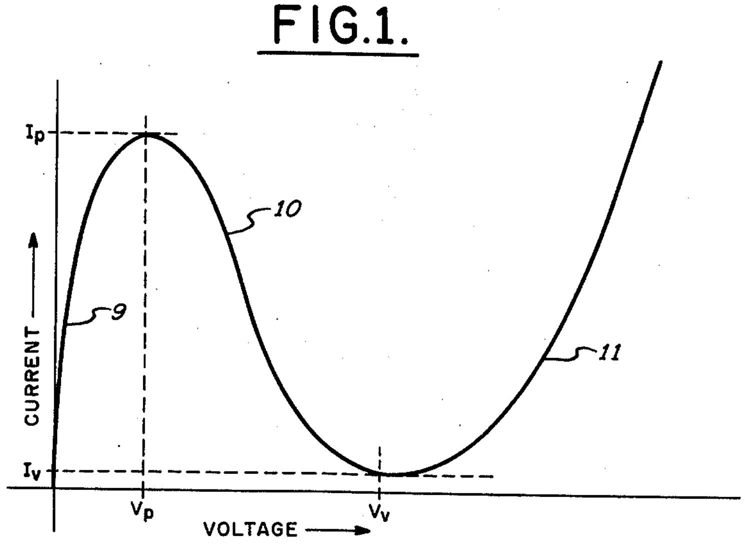
FIG. 2 is a representative plot of the current-voltage characteristic of a typical tunnel diode.

The assembled tunnel diode of FIG. 1 exhibits a current-voltage characteristic typified by the curve of FIG. 2. FIG. 2 is a plot of current flow in the forward direction of a tunnel diode in response to different amounts of applied voltage. More particularly, when there is no potential difference between dumet electrodes 4 and 6, no current flows. As the potential of electrode 6 increases positively with respect to the potential of electrode 4, the forward conduction current of the diode increases in accordance with the rising portion 9 of the characteristic curve until the maximum or peak current value of $I_P$ is reached. A further increase in the positive potential applied to electrode 6 causes the diode current to decrease along the negative resistance portion 10 of the curve toward a minimum or valley value $I_V$. As the potential of electrode 6 increases beyond the value $V_V$, the tunnel diode current begins to increase along the exponential portion 11 of the characteristic curve. The portion 11 represents the normal forward conduction of the diode attributable to minority carrier injection as opposed to the tunneling phenomenon associated with portions 9 and 10.

The peak-to-valley ratio of the characteristic curve of FIG. 2 is a figure of merit of the tunnel diode. In general, the higher the peak-to-valley ratio, the better the diode. A minimum acceptable ratio is of the order of about 5:1. The peak current $I_P$ desired of a given tunnel diode is determined in accordance with circuit requirements. It is desirable that the peak current value be closely controlled to meet a given specification. In accordance with the present invention, the criteria of a high peak-to-valley ratio and a closely controlled value of peak current are simultaneously met by the monitored etching of the junction surface between the germanium wafer 1 and the indium-gallium pellet 2 of FIG. 1.

Figure 3:
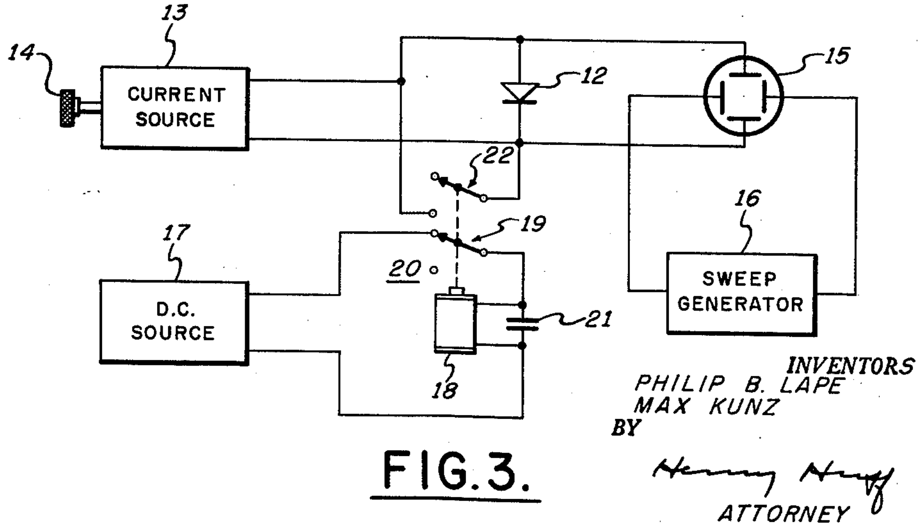
FIG. 3 is a simplified schematic drawing of apparatus useful in the execution of the method of the present invention.

Diode 12 of FIG. 3 represents the diode structure comprising gold wafer 3 and the P–N junction formed by germanium wafer 1 and pellet 2 of FIG. 1. A controllable source of current 13 is connected across the terminals of the structure, i.e., across the gold wafer and the indium-gallium pellet. Control of the value of current produced by source 13 is effected by means of manual adjuster 14. The terminals of the diode 12 are connected to respective ones of the vertical deflection plates of conventional cathode ray tube 15. A recurrent sweep deflection potential is generated by conventional generator 16 and applied to the horizontal deflection plates of tube 15.

Provision is made for periodically altering the flow of current from source 13 to diode 12. In the illustrative embodiment of FIG. 3, such altering is accomplished by periodically short circuiting the terminals of diode 12. D.C. source 17, the control coil 18 and first contacts 19 of a relay 20 together comprise a relaxation oscillator, the frequency of which is determined by the value of capacitor 21 connected across control coil 18. When contacts 19 are in the deactuated position shown in the figure, current slowly increases in the control coil 18 of relay 20 as capacitor 21 charges. When the current flow in coil 18 has increased sufficiently, relay 20 is energized causing the deactuation of contacts 19. Relay 20 is deenergized upon the deactuation of contacts 19, whereupon the cycle of actuation and deactuation of contacts 19 repeats. In a typical case, capacitor 21 may be selected to produce successive actuations of contacts 19 at a rate of about one cycle per second. Contacts 22 of relay 20 are ganged with contacts 19 and are actuated simultaneously therewith. Thus, the terminals of diode 12 are successively short-circuited at one second intervals.

According to the method of the present invention, source 13 is adjusted to produce a current substantially equal to the desired peak current which diode 12 is to exhibit. Then an etching solution preferably consisting of three parts sodium hydroxide to one part hydrogen peroxide, diluted five to one with distilled water, is applied to diode 12. The solution preferentially etches the P–N junction at the base perimeter of pellet 2 and reduces the peak current characteristic of the diode junction. As long as the peak tunneling current of the diode is above the value of the current produced by source 13, a very small potential appears across the terminals of diode 12 irrespective of the actuation or deactuation of contacts 22. It has been found, however, that at the moment that the peak tunneling current of the diode falls below the value of the current produced by source 13, an abrupt increase in potential is produced across the terminals of diode 12 upon each deactuation of contacts 22, i.e., each time that the short circuit is removed from the diode terminals.

The abrupt change in potential across the terminals of diode 12 may be readily monitored by observing the display produced by tube 15. In particular, two widely separated horizontal traces appear on the face of tube 15 when the peak tunneling current of diode 12 has been reduced to substantially the value of the current produced by source 13; otherwise, a single trace or two narrowly separated horizontal traces appear. When the operator who is controlling the etching process first observes an abrupt increase in the vertical separation between the two horizontal traces appearing on the face of tube 15, he is informed that the etching process has produced the desired value of peak tunneling current in the diode. The operator thereupon quenches the etching action by dousing the P–N junction 12 with distilled water.

Any desired value of peak tunneling current may be produced in a given P–N junction merely by adjusting the value of the current produced by source 13 to the desired amount. It is only necessary that the desired amount be less than the peak tunneling current value of the diode prior to the commencement of the etching operation.

By virtue of the abrupt and marked indication produced on the face of tube 15, production quantities of tunnel diodes may be etched in accordance with the method of the present invention with each diode uniformly exhibiting the same desired value of peak tunneling current.

While the invention has been described in its preferred embodiments, it is understood that the words which have been used are words of description rather than of limitation and that changes within the purview of the appended claims may be made without departing from the true scope and spirit of the invention in its broader aspects.

What is claimed is:

1. A method for controlling the current-voltage characteristic of a tunnel diode comprising the steps of applying a current having a predetermined value to the terminals of said diode, said predetermined value substantially equaling the desired peak current value of said characteristic, occasionally altering the magnitude of said current from said predetermined value to a value less than said predetermined value, continuously monitoring the potential which appears across said terminals, applying a solution for etching the junction surface of said diode, and stopping the etching action of said solution when a change is observed in the monitored value of the potential across said terminals.

2. A method for controlling the current-voltage characteristic of a tunnel diode comprising the steps of applying a current having a predetermined value to the terminals of said diode, said predetermined value substantially equaling the desired peak current value of said characteristic, occasionally diverting the flow of said predetermined current from said terminals, continuously monitoring the potential which appears across said terminals, applying a solution for etching the junction surface of said diode, and quenching the etching action of said solution when a change is observed in the monitored value of the potential across said terminals.

3. A method for controlling the current-voltage characteristic of a tunnel diode comprising the steps of applying a current having a predetermined value to the terminals of said diode, said predetermined value substantially equaling the desired peak current value of said characteristic, periodically shortcircuiting said terminals of said diode, continuously monitoring the potential which appears across said terminals of said diode, applying a solution for etching the junction surface of said diode, and quenching the etching action of said solution when a change is observed in the monitored value of the potential across said terminals of said diode.

4. A method for establishing a predetermined peak current in the current-voltage characteristic of a tunnel diode comprising the steps of applying to the terminals of said diode a current having a value substantially equal to the value of said predetermined peak current, periodically shortcircuiting said terminals of said diode, continuously monitoring the potential which appears across said terminals of said diode, applying a solution for etching the junction surface of said diode, and flooding said diode with a liquid for quenching the etching action of said solution when a change is observed in the monitored value of the potential across said terminals of said diode.

5. A method for controlling the current-voltage characteristic of a germanium tunnel diode comprising the steps of applying a current having a predetermined value to the terminals of said diode, said predetermined value substantially equaling the desired peak current value of said characteristic, occasionally altering the magnitude of said current from said predetermined value to a value less than said predetermined value, continuously monitoring the potential which appears across said terminals, applying a solution for etching the junction surface of said diode, said solution comprising sodium hydroxide, hydrogen peroxide and water, and quenching the etching action of said solution when an abrupt change is observed in the monitored value of the potential across said terminals.

6. A method for controlling the current-voltage characteristic of a germanium tunnel diode comprising the steps of applying a current having a predetermined value to the terminals of said diode, said predetermined value substantially equaling the desired peak current value of said characteristic, periodically shortcircuiting said terminals of said diode, continuously monitoring the potential which appears across said terminals of said diode, applying a solution for etching the junction surface of said diode, said solution comprising sodium hydroxide, hydrogen peroxide, and water and quenching the etching action of said solution when an abrupt change is observed in the monitored value of the potential across said terminals of said diode.

7. A method for controlling the current-voltage characteristic of a germanium tunnel diode comprising the steps of applying a current having a predetermined value to the terminals of said diode, said predetermined value substantially equaling the desired peak current value of said characteristic, periodically shortcircuiting said terminals of said diode, continuously monitoring the potential which appears across said terminals of said diode, applying a solution for etching the junction surface of said diode, said solution comprising sodium hydroxide, hydrogen peroxide and water, and quenching the etching action of said solution by flooding said diode with distilled water when an abrupt change is observed in the monitored value of the potential across said terminals of said diode.

8. A method for controlliing the current-voltage characteristic of a tunnel diode comprising the steps of applying a current having a predetermined value to the terminals of said diode, said predetermined value substantially equaling the desired peak current value of said characteristic, continuously monitoring the potential which appears across said terminals, applying a solution for etching the junction surface of said diode, and stopping the etching action of said solution when a change is observed in the monitored value of the potential across said terminals.

References Cited by the Examiner

UNITED STATES PATENTS

| | | | |
|---|---|---|---|
| 2,577,803 | 12/51 | Pfann | 156—17 XR |
| 2,615,966 | 10/52 | Lark-Horovitz et al. | 156—17 XR |
| 2,637,770 | 5/53 | Lark-Horovitz et al. | 156—17 XR |
| 2,740,699 | 4/56 | Koury | 156—17 |
| 2,809,103 | 10/57 | Alexander | 156—17 |
| 2,827,724 | 3/58 | Edds | 134—57 XR |
| 2,827,725 | 3/58 | Edds | 156—345 |
| 3,001,112 | 9/61 | Murad | 148—1.5 XR |
| 3,054,709 | 9/62 | Freestone et al. | 156—17 |
| 3,081,418 | 3/63 | Manintveld et al. | |
| 3,117,899 | 1/64 | McLouski | 156—17 |

OTHER REFERENCES

I.B.M. Tech. Disclosure Bulletin, "Etching Esaki Diodes," Davis, February 1961, vol. 3, No. 9, 156-17.

EARL M. BERGERT, *Primary Examiner.*

CARL F. KRAFFT, HAROLD ANSHER, *Examiners.*